United States Patent [19]                [11]  Patent Number:     5,287,366
Epworth et al.                                  [45]  Date of Patent:    Feb. 15, 1994

[54] BINARY MODULATION OF INJECTION LASERS

[75] Inventors: Richard E. Epworth, Sawbridgeworth; Peter J. Anslow, Bishop's Stortford, both of United Kingdom

[73] Assignee: Northern Telecom Europe Limited, Montreal, Canada

[21] Appl. No.: 890,566

[22] Filed: May 28, 1992

[30]  Foreign Application Priority Data

May 29, 1991 [GB] United Kingdom ............... 9111552

[51] Int. Cl.⁵ ............................................. H01S 3/10
[52] U.S. Cl. ........................................ 372/26; 372/31
[58] Field of Search ............................ 372/26, 29, 31

[56]           References Cited
        U.S. PATENT DOCUMENTS 5,003,546  3/1991  Lidgard et al. ............... 372/29
5,204,640  4/1993  Logan, Jr. ..................... 372/33

FOREIGN PATENT DOCUMENTS 2066557A  7/1981  United Kingdom .
2168838A  6/1986  United Kingdom .

OTHER PUBLICATIONS

D. W. Smith et al, 'Laser Level Control for High Bit Rate Optical Fibre Systems', paper presented at 13th Circuits and Systems International Symposium Houston, Apr. 1980.

Primary Examiner—James W. Davie
Attorney, Agent, or Firm—Lee, Mann, Smith, McWilliams, Sweeney & Ohlson

[57]           ABSTRACT

An injection laser driver regulates the bias and modulation depth by means of two feedback control loops, one deriving its feedback control signal from a measure of the mean optical output of the laser, and the other deriving its feedback control signal from a measure of the spectral purity of that optical output. The spectral purity measure is conveniently effected by measuring the coherence function at a specific value of differential delay using a Mach-Zehnder interferometer configuration with a passive quadrature optical network.

19 Claims, 4 Drawing Sheets

BINARY MODULATION OF INJECTION LASERS

BACKGROUND TO THE INVENTION

This invention relates to the binary modulation of injection lasers, and is particularly concerned with the regulation of the bias level and modulation depth to provide operation which on the one hand provides good extinction, while on the other hand does not produce excessive chirp. Chirp needs to be limited, particularly in a long distance transmission system, so as to avoid imposing unnecessary bandwidth limitations as a result of the pulse-broadening effects of chromatic dispersion exhibited by that system. Chirp can be limited by ensuring that the drive maintains the laser somewhat above its lasing threshold even during the lower drive current (data 0) bit periods, but the higher that the current is maintained for data 0 bit periods, the poorer the extinction.

A difficulty with trying to achieve optimal drive conditions is that the lasing threshold current, and the slope of the laser characteristic which plots light output as a function of current drive, are liable to vary not only from laser to laser, but also, in any given laser, as a function of its temperature and as a property of the ageing process of that laser.

One way of dealing with these problems is to employ two feedback control loops. One of these loops derives a feedback control signal that is indicative of the mean light output power from the laser and employs this to regulate the laser. Assuming the use of a balanced code, and a linear relationship between light output and laser drive between the data 0 drive current level $i_0$ and the data 1 drive current level $i_1$, the loop operates to provide a mean drive current $(i_0+i_1)/2$. The other feedback loop derives a feedback control signal that is indicative of the lasing threshold and employs this to regulate the value $i_0$ to be just above the lasing threshold value. If it is safe to assume that the slope of the laser characteristic between current values $i_0$ and $i_1$ will not vary too much, the first loop can be dispensed with. Under these circumstances the sole feedback control loop regulates the laser bias and the modulation depth $(i_1-i_0)$ is maintained at a constant preset value.

One particular way of constructing a feedback control loop to derive a feedback control signal indicative of the laser threshold current is described by D. W. Smith et al in the paper entitled 'Laser Level Control for High Bit Rate Optical Fibre Systems' given at the 13th Circuits and Systems International Symposium Houston April 1980. This involves impressing a small amplitude low frequency current modulation, a ripple, upon the data '0's, this low frequency modulation being within the pass-band of a monitor photodiode and its associated circuitry. The slope of the characteristic which plots light output as a function of drive current, changes as the drive current is increased through the lasing threshold from a relatively lower value to a relatively higher value. The ripple on the laser drive current therefore produces a corresponding ripple on the monitor photodiode current, and this is compared with a preset value to provide a feedback control signal which is employed to regulate $I_0$ to a particular slope value intended to correspond to a point just above lasing threshold. Problems encountered with this approach are attributable to the fact that the shape of the characteristic is liable to vary from laser to laser, making it difficult to choose an optimum value of slope as the target of the feedback loop, and also to the fact that an individual laser may exhibit that target value of slope over an extended range of current drive levels in the vicinity of the optimum operating point.

SUMMARY OF THE INVENTION

This invention is directed to an alternative method of feedback control for an injection laser, one which forms a measure of the spectral purity of the emission of the laser. An advantage of this approach is that the feedback regulation is controlled by the parameter, spectral purity, that directly affects the chromatic dispersion penalty of an optical transmission system employing the laser.

It is the chirp associated with data '0' to data '1' bit transitions that provides the primary limitation upon spectral purity of laser emission, and thus is generally of primary significance in relation to the dispersion of the optical system in which the laser is operating. In principle it is possible to assess the spectral properties of individual transitions, but generally it is more convenient to look at the time-averaged value of spectral purity, time-averaged over a long enough period to ensure a known transition density. If the response of a photodetector is too fast to perform the necessary time-averaging on its own, its effective response may be slowed by placing a low-pass filter in its output.

According to the present invention there is provided a method of binary modulation of an injection laser in which the laser is driven with a first, relatively lower, drive current for data bits of one data significance, and with a second, relatively higher, drive current for data bits of the other data significance, in which the laser drive current of the lower drive current bits is regulated at least in part by a feedback control loop which derives at least a part of its feedback control signal from a measure of the spectral purity of the optical output of the injection laser.

The invention also provides an injection laser modulation driver with at least one feedback control loop adapted to regulate the laser current drive, which loop incorporates means adapted to measure the spectral purity of the optical output of the injection laser.

BRIEF DESCRIPTION OF THE DRAWINGS

There follows a description of injection laser bias control methods embodying the invention in preferred forms. The description refers to the accompanying drawings in which.

DETAILED DESCRIPTION OF PREFERRED EMBODIMENTS

Figure 1:
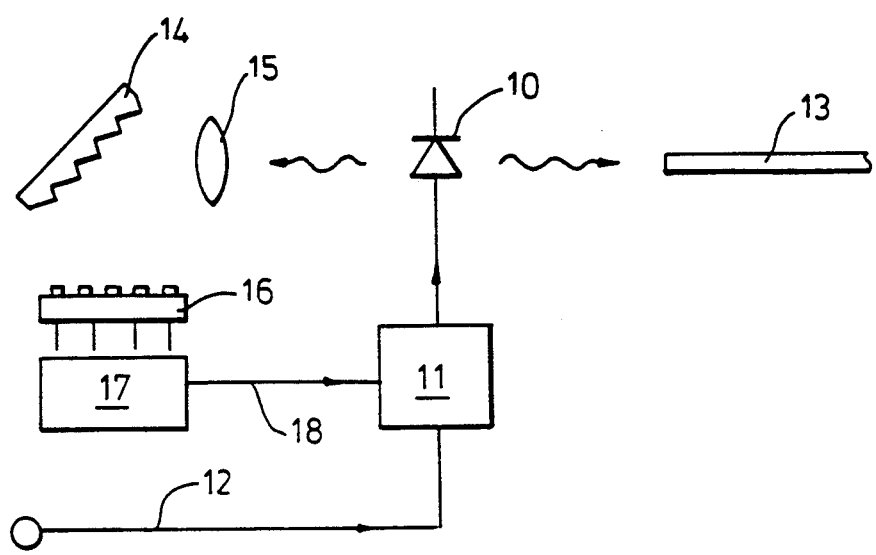
FIG. 1 is a schematic diagram of an injection laser driver using a form of monochrometer for spectral analysis.

The spectral purity of the output of an optical source can be directly determined by feeding that output to a dispersive element such as a monochromator diffraction grating. For regulation purposes of the optical output of an injection laser, the resulting diffracted optical signal has to be processed to produce a single electrical signal for employment as a feedback control signal regulating the laser drive current. Referring to FIG. 1, an injection laser 10 receives its drive current from a modulator 11 furnished with data over a line 12. The majority of the laser output is delivered into utilisation circuitry represented in particular in the Figure by an optical fibre 13. Some light is however emitted from the rear of the laser to be incident upon a diffraction grating 14. A converging lens 15 brings the diffracted light, depending on its wavelength, to an approximate focus upon a particular one of an integrated set of photodiodes 16. The outputs of the diodes are fed to a processor unit 17 which analyses the spectral power distribution of the received light to provide a control signal on line 18 which is used as a feedback control signal to regulate the output of the modulator 11.

Figure 2:
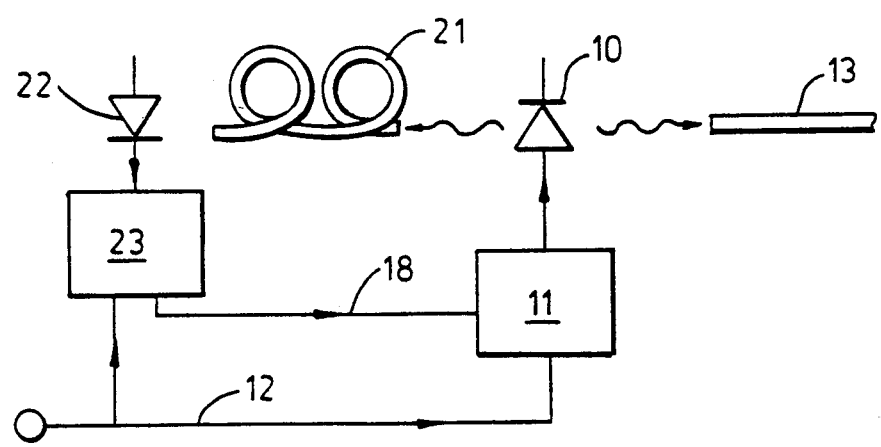
FIG. 2 is a schematic diagram of an injection laser driver using a length of high dispersion fibre for spectral analysis.

The laser driver of FIG. 2 employs an alternative form of dispersion effect for its feedback control. In this instance the light from the rear of the laser 10 is directed into a length 21 of highly dispersive fibre and from there to a single detector 22. The output of the detector 22 is fed to an electrical spectrum analyser 23 which analyses the frequency spectrum of the received data, and compares this with the frequency spectrum of the data applied on line 12 directly to the laser's modulator 11. In the presence of laser chirp, the differential delay provided by the dispersion of the fibre 21 removes the higher frequency components of the data from the signal received by the spectrum analyser 23 from the detector 22, and, thus, in the presence of data applied on line 12, the comparison afforded by the spectrum analyser is able to provide, on line 18, a feedback control signal characterising the spectral width of the emission of laser 10.

Figure 3:
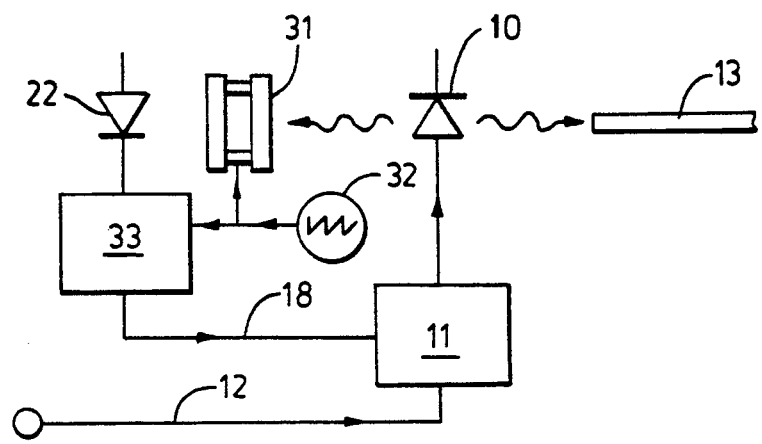
FIG. 3 is a schematic diagram of an injection laser driver using a Fabry Perot etalon for spectral analysis.

The laser driver of FIG. 3 employs yet another form of dispersion effect for its feedback control. In this instance the light from the rear of the laser 10 is directed through a scanning Fabry Perot etalon 31 to the single photodetector 22. A scanning voltage ramp source 32 applies a saw-tooth voltage waveform to one or more piezoelectric transducers forming part of the etalon 32 to cause it to scan repetitively the narrow pass-band of the etalon through the full emission wavelength range of the laser 10. The amplitude of the output of the photodetector, which is fed to a processor 33, is thus caused to vary with time in a manner dependent upon the spectral content of the laser emission. A narrow spectral emission will therefore result in a low duty ratio pulsed output from the detector with a pulse repetition frequency determined by that of the source 32. A wider spectral emission will produce a correspondingly higher duty ratio pulsed output with the same pulse repetition frequency. Thus the processor 33 is enabled to provide a feedback control signal output on line 18 to regulate the current output provided by modulator 11.

Only one feedback control loop has so far been specifically described in each of the laser drivers of FIGS. 1, 2 and 3. If there is no second feedback control loop, then the sole feedback control loop is employed in the modulator 11 to regulate the bias current that it applies to the laser 10 while the modulation depth, the difference between the data '1' bit drive current $i_1$ and the data '0' bit drive current $i_0$, is maintained at a preset constant value. Generally however the feedback control loop that regulates spectral purity is employed in conjunction with a second feedback loop that regulates the mean light output of the laser 10. For this purpose a second photodetector (not shown in FIGS. 1, 2 or 3) is positioned to receive an undiffracted proportion of the light emitted by the laser. This second photodetector may have a slow enough response to perform the necessary averaging by itself, or the time-averaging provided by the response time of the photodetector may be supplemented by passing the photodetector output through a low-pass filter (not shown in FIGS. 1, 2 or 3) before applying it to the modulator 11.

When two feedback control loops are employed, they co-operate to regulate both the bias and the modulation depth. One loop directly regulates the laser bias, while the other loop co-operates with the first in regulating the modulation depth. The organisation of the modulator 11 determines which loop performs which function. If the modulation is unipolar, the bias current is equal to the data '0' bit current $i_0$, and the data '1' bit current $i_1$ is given by the expression $i_1 = i_0 + i_m$, where $i_m$ is the modulation current (modulation depth). Under these circumstances the spectral purity loop regulates the bias current $i_0$, while the mean light output loop regulates the value $(i_0 + i_1)/2$. This is equal to $i_0 + i_m/2$ and, since the other loop is regulating $i_0$, this loop, the mean light output loop, is seen to have the effect of co-operating with the other loop in regulating the value $i_m$. On the other hand, if the modulation is bipolar, the bias is maintained at the value $(i_0 + i_1)/2$ directly by the mean light output loop. Under these circumstances the spectral purity loop, by regulating the value $i_0$, is having the effect of regulating the value of $i_m$ because $i_m/2 = (i_0 + i_1)/2 - i_0$.

A measure of the spectral quality of the laser emission may alternatively be ascertained by measuring the time-averaged coherence of that emission. For this purpose it is not necessary to measure the full coherence function, but instead it is sufficient to measure the degree of coherence over one specific value of differential delay. Conveniently, this measurement can be made using a fixed path difference Mach-Zehnder interferometer operating with a path difference of a few millimeters. The degree of coherence can then be determined by measuring the fringe visibility (contrast). This can be accomplished using a form of output coupler in the Mach-Zehnder interferometer that provides in-phase and quadrature (I and Q) outputs together with two photodetectors. Alternatively, a single detector arrangement can be used with a form of Mach-Zehnder interferometer which incorporates a phase modulator in one of its arms to dither the phase between the I and Q values.

Figure 4:
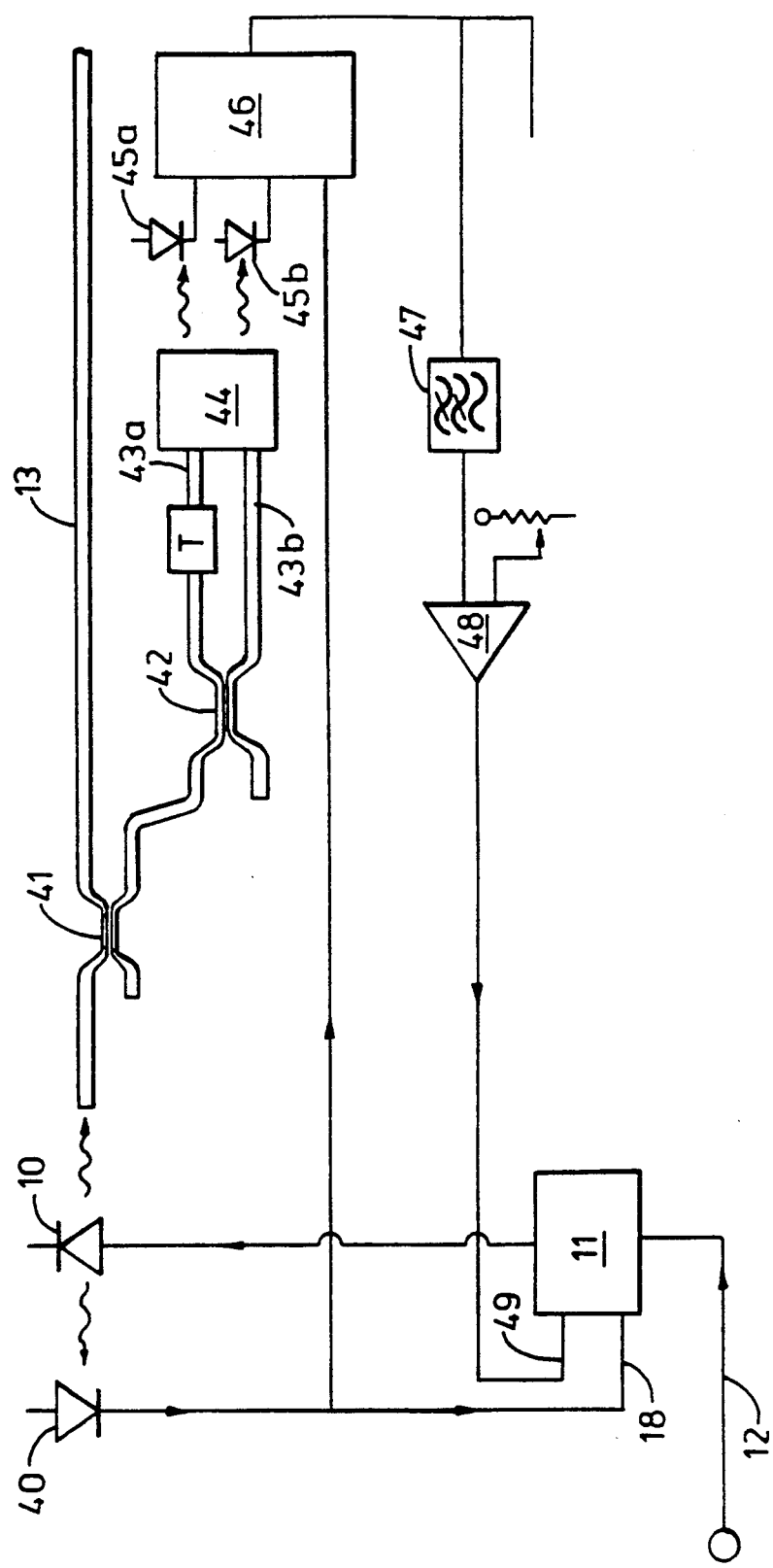
FIG. 4 is a schematic diagram of an injection laser driver using a Mach-Zehnder interferometer for spectral analysis.

The laser driver of FIG. 4 is an example of a driver using a Mach-Zehnder interferometer to obtain a measure of the coherence of the laser output, this driver has two feedback loops, and uses the coherence measure in one feedback control loop to regulate the value $i_0$, while a second loop uses a control signal derived from a measure of the mean power output of the laser to regulate the drive current value $(i_0 + i_1)/2$.

In the laser driver of FIG. 4 the laser 10 is supplied with current from a modulator 11 which is supplied with data over line 12. A monitor photodiode 40 is positioned to receive light emitted from the rear facet of the laser and thus provide an output representative of the mean power output of the laser. This output is applied as a feedback control loop signal to the modulator 11 on line 18 to regulate the value $(i_0+i_1)/2$. A portion of the light from laser 10 launched into fibre 13 is additionally tapped off, for instance by means of a fibre coupler 41, to feed a Mach-Zehnder interferometer which forms part of the feedback control loop that regulates modulation depth. This interferometer is constituted by a 3 dB fibre coupler 42 which divides the input power equally between the two arms 43a and 43b of the interferometer, and a passive quadrature network 44 providing I and Q outputs fed to two photodetectors 45a and 45b. Arm 43a of the interferometer is longer than arm 43b by an amount introducing a differential delay T. The outputs of the two photodetectors 45a and 45b, together with the output of photodetector 22, are fed to coherence evaluation circuitry 46 which provides an output fed via a low-pass filter 47 to a comparator 48. The other input to the comparator is a pre-set reference level, and the output of the comparator provides a feedback control signal applied to the modulator on line 49 for regulating the value $i_0$ to provide the laser output with a controlled measure of spectral purity determined by the pre-set reference level applied to comparator 48.

The passive phase quadrature network 44 may take the form of a cross-coupled array of four 2×2 couplers as for instance described by D. W. Stowe et al in Journal of Lightwave Technology Vol LT-1 No 3 September 1983 pp 519–523 incorporating an extra λ/4 optical path length in one of the cross couplings. Such a coupler has four outputs, including in addition to the I and Q outputs, $\bar{I}$ and $\bar{Q}$ outputs, and so to make use of the extra outputs the single photodetectors 44a and 44b can be respectively replaced with series connected pairs of photodiodes with the signal taken from the common node, one pair positioned respectively to receive the I and $\bar{I}$ outputs, and the other pair to receive Q and $\bar{Q}$ outputs.

If there were full coherence between the light entering the passive quadrature network 44 by way of arm 43a and that entering it by way of arm 43b then the output currents of the two photodetectors 45a and 45b respectively $i_a$ $i_b$ would be:

$$I_a = A(1+\sin\phi)$$

and $$i_b = A(1+\cos\phi)$$

where $\phi$ is the phase angle provided by the differential delay T between the two arms 43a and 43b of the interferometer.

If, on the other hand, there were no coherence, then there would be no dependence upon phase angle $\phi$ and $$i_a = i_b = A$$

with partial coherence the outputs are clearly given by $$i_a = A + B\sin\phi$$

and $$i_b = A + B\cos\phi$$

where $0 \leq B \leq A$

B=A for full coherence, and B=O for the no coherence condition. A is a measure of the mean light output averaged over all phase angles $\phi$ and is directly derivable from the current output $i_c$ of photodetector 40

$$i_c = kA,$$

where k is a constant.

The coherence evaluation circuitry therefore evaluates B by subtracting $i_c/k$ from both photocurrents $i_a$ and $i_b$ to form respectively B sin $\theta$ and B cos $\frac{1}{4}$.

It then squares and adds both these to evaluate $B^2$, thus providing a measure of the coherence function at the particular chosen delay value T.

It is not necessary to use a passive quadrature network 44 to achieve the I and Q signals employed by the coherence evaluation circuitry 46. The requisite I and Q signals can for instance be evaluated from the 120° separated signals produced using a 3×3 fibre couples in place of the passive quadrature network 44. Alternatively a 2×2 fibre coupler can be used in its place together with a phase modulator (not shown) in one arm of the interferometer. In these circumstances the I and Q signals are obtained by modulating the phase through $\pi/2$ and sampling the resultant output from the 2×2 coupler.

Figure 5:
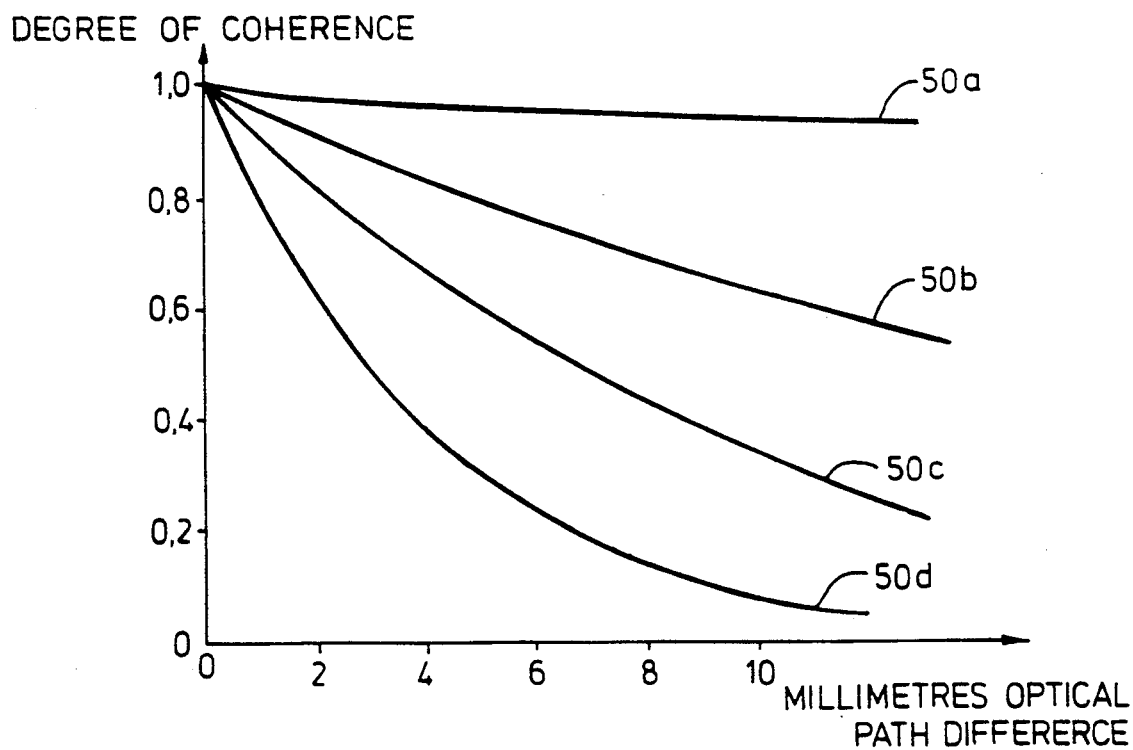
FIG. 5 depicts the general shape of coherence characteristic of a single mode DFB laser at different values of drive current.

FIG. 5 depicts the general shape of the coherence characteristics 50a to 50d for a single mode DFB laser as a function of optical path difference between the two arms of the interferometer for four different values of laser drive current. All four drive currents are above threshold currents, that associated with characteristic 50a being the smallest of the four currents, and that associated with 50d being the largest.

Figure 6:
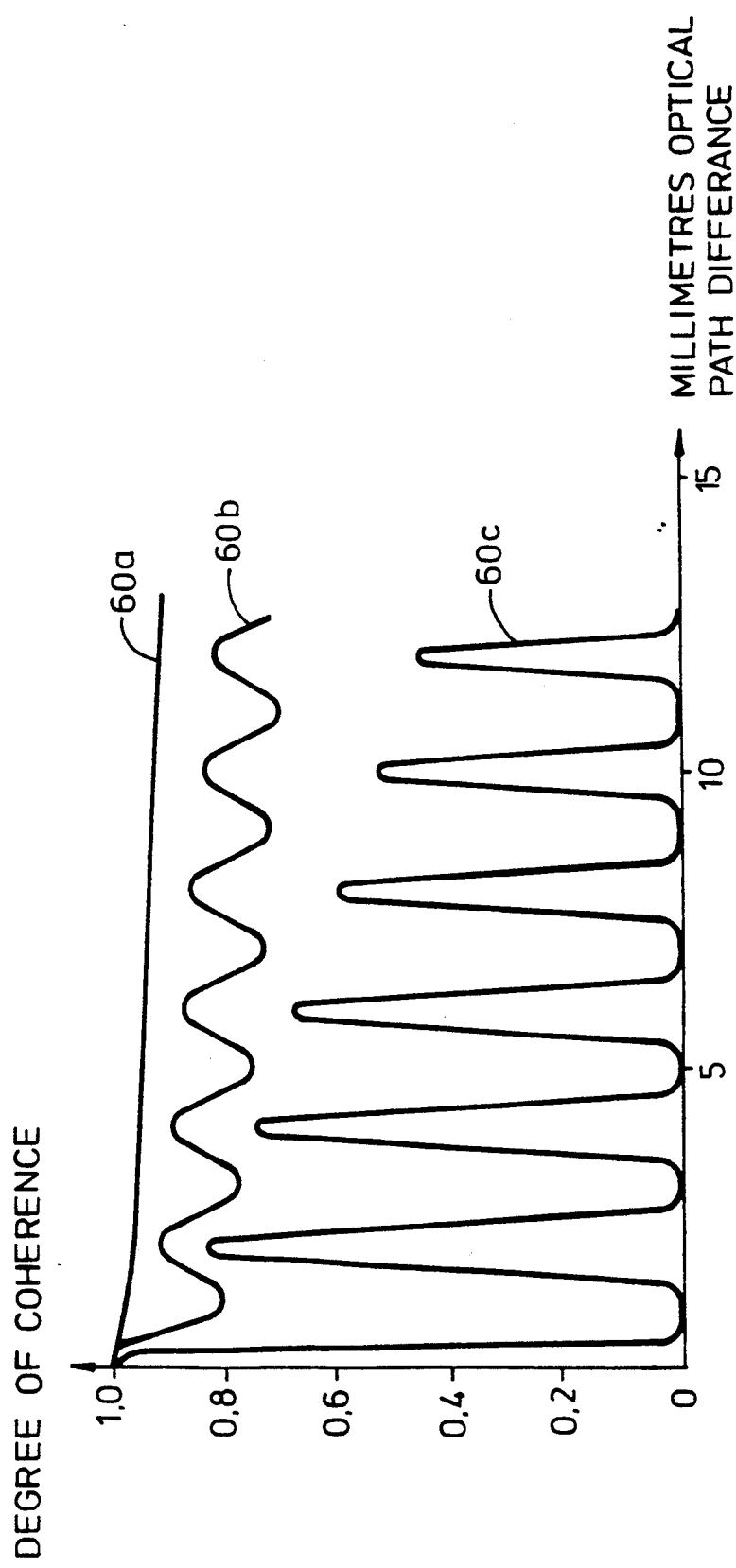
FIG. 6 depicts how the coherence characteristic of a Fabry Perot laser changes when the drive current is increased so as to introduce stimulation of additional longitudinal laser modes.

As illustrated in FIG. 6, the general shape of coherence characteristics is changed by the presence of more than one mode in the output spectrum of the laser. Characteristic 60a illustrates the general shape when only one mode is present, while characteristic 60b illustrates a typical characteristic when, in addition to the main mode, there is a single side mode. Characteristic 60c is typical of a multilongitudinal mode output. It will be appreciated from these characteristics that, when more than one mode is potentially involved, increased sensitivity is provided by choosing a value T that registers with troughs in the characteristics rather than peaks.

In many instances the feedback control loop signal resulting from a measure of the spectral quality of the injection laser's emission is advantageously used on its own so as to maintain a constant, but small value, of chromatic dispersion penalty in the optical system in which the laser is operating. However, if the laser spectral properties degrade excessively, such a control system can give rise to a situation in which, in an effort to maintain a low dispersion penalty, the modulation depth is reduced to the point at which the extinction penalty exceeds the dispersion penalty. This problem can be avoided by arranging the feedback control to be dependent only in part upon the spectral quality, adding to this spectral quality dependence a dependence upon mean laser light output. Under these circumstances the value to which the spectral quality is stabilised can be adjusted in relation to laser bias so as to keep the total penalty substantially at a minimum.

A particularly simple form of dual control, albeit one that does not maintain a minimum penalty, is one in which the minimum modulation depth is limited. Under normal circumstances the chromatic dispersion penalty is thereby stabilised by varying the modulation depth, but if ever the control loop operates to try and reduce the modulation depth below this minimum, the loop is prevented from operating in this manner, and further degradation of the laser characteristics will merely result in increasing eye closure due to chromatic dispersion.

It will be noted that, since chirp is caused by modulation of the laser drive current, the mean value of spectral quality will vary with the density of transitions (changes in drive current level). Thus, when used with Non Return to Zero data with long sequences of data '1's or data '0's, it is necessary to average the measurement of spectral quality over a sufficient time that the mean density of transitions is constant. Alternatively the measure of spectral quality needs to be scaled with the mean transition density of the data before being used for feedback control purposes.

We claim:

1. A method of binary modulation of an injection laser in which the laser is driven with a first, relatively lower, drive current for data bits of one data significance, and with a second, relatively higher, drive current for data bits of the other data significance, in which the laser drive current of the lower drive current bits is regulated at least in part by a feedback control loop which derives at least a part of its feedback control signal from a measure of the spectral purity of the optical output of the injection laser.

2. A method as claimed in claim 1, wherein the measure of spectral purity is derived from a measure of the time-averaged coherence function of the optical output of the laser.

3. A method as claimed in claim 2, wherein the measure of the time-averaged coherence function is a measure of that function at one specific value of differential delay.

4. A method as claimed in claim 3, wherein the measure of the time-averaged coherence function is made using a Mach-Zehnder interferometer.

5. A method as claimed in claim 4, wherein the Mach-Zehnder interferometer includes a passive quadrature optical network.

6. A method as claimed in claim 5, wherein the passive quadrature network directly provides 90° phase-separated outputs.

7. A method as claimed in claim 4, wherein 90° phase-separated outputs from the interferometer are derived from a passive optical network providing 120° phase-separated outputs.

8. A method as claimed in claim 2, wherein the measure of time-averaged coherence function is made using a Mach-Zehnder interferometer, the optical path length of one arm of which is modulated to provide time-shared 90° phase-separated outputs.

9. A method as claimed in claim 1, wherein the measure of spectral purity is made using a scanning Fabry Perot interference filter.

10. A method as claimed in claim 1, wherein the measure of spectral purity is made using transmission through a length of high dispersion optical fibre, a photodetector and an electrical spectrum analyser.

11. A method as claimed in claim 1, wherein the mean laser optical output is maintained at a constant value by a feedback loop regulating the mean laser drive current.

12. A method as claimed in claim 11, wherein the drive current of the lower drive current bit is regulated in part by the feedback control signal derived from a measure of the spectral purity of the optical output of the laser and in part by means which prevents the laser drive current difference maintained between lower drive current bits and higher drive current bits from being reduced beneath a predetermined threshold value.

13. A method as claimed in claim 11, wherein the drive current of the lower drive current bit is regulated in part by the feedback control signal derived from a measure of the spectral purity of the optical output of the laser and in part by the feedback control signal which regulates the mean laser drive current to maintain the mean laser optical output at a constant value.

14. A method as claimed in claim 2, wherein the mean laser optical output is maintained at a constant value by a feedback loop regulating the mean laser drive current.

15. A method as claimed in claim 14, wherein the drive current of the lower drive current bit is regulated in part by the feedback control signal derived from a measure of the spectral purity of the optical output of the laser and in part by means which prevents the laser drive current difference maintained between lower drive current bits and higher drive current bits from being reduced beneath a predetermined threshold value.

16. A method as claimed in claim 14, wherein the drive current of the lower drive current bit is regulated in part by the feedback control signal derived from a measure of the spectral purity of the optical output of the laser and in part by the feedback control signal which regulates the mean laser drive current to maintain the mean laser optical output at a constant value.

17. A method as claimed in claim 3, wherein the mean laser optical output is maintained at a constant value by a feedback loop regulating the mean laser drive current.

18. A method as claimed in claim 17, wherein the drive current of the lower drive current bit is regulated in part by the feedback control signal derived from a measure of the spectral purity of the optical output of the laser and in part by means which prevents the laser drive current difference maintained between lower drive current bits and higher drive current bits from being reduced beneath a predetermined threshold value.

19. A method as claimed in claim 18, wherein the drive current of the lower drive current bit is regulated in part by the feedback control signal derived from a measure of the spectral purity of the optical output of the laser and in part by the feedback control signal which regulates the mean laser drive current to maintain the mean laser optical output at a constant value.

* * * * *